US008799725B2

(12) United States Patent
Roohparvar et al.

(10) Patent No.: US 8,799,725 B2
(45) Date of Patent: Aug. 5, 2014

(54) MACRO AND COMMAND EXECUTION FROM MEMORY ARRAY

(71) Applicant: Micron Technology, Inc., Boise, ID (US)

(72) Inventors: Frankie F. Roohparvar, Monte Sereno, CA (US); Benjamin Louie, Fremont, CA (US)

(73) Assignee: Micron Technology, Boise, ID (US)

(*) Notice: Subject to any disclaimer, the term of this patent is extended or adjusted under 35 U.S.C. 154(b) by 0 days.

(21) Appl. No.: 14/034,159

(22) Filed: Sep. 23, 2013

(65) Prior Publication Data

US 2014/0026005 A1 Jan. 23, 2014

Related U.S. Application Data

(60) Continuation of application No. 13/651,931, filed on Oct. 15, 2012, now Pat. No. 8,543,874, which is a division of application No. 13/346,290, filed on Jan. 9, 2012, now Pat. No. 8,291,272, which is a division of application No. 12/261,857, filed on Oct. 30, 2008, now Pat. No. 8,095,834.

(51) Int. Cl.
*G11C 29/00* (2006.01)
*G11C 16/04* (2006.01)

(52) U.S. Cl.
USPC ...................................... 714/718; 365/185.33

(58) Field of Classification Search
CPC ........................................................ G11C 29/16

USPC ........ 714/42, 30, 25, 733, 734, 718, E11.092, 714/E11.159, 6.2; 711/154, E12.001; 365/201, 185.33, 230.03
See application file for complete search history.

(56) References Cited

U.S. PATENT DOCUMENTS

| | | | |
|---|---|---|---|
| 7,075,822 B2 * | 7/2006 | Elmhurst et al. | 365/185.03 |
| 7,177,186 B2 * | 2/2007 | Elmhurst et al. | 365/185.03 |
| 7,327,605 B2 | 2/2008 | Elmhurst et al. | |
| 7,818,638 B2 | 10/2010 | Baker | |
| 7,882,405 B2 | 2/2011 | Reggiori et al. | |
| 8,095,834 B2 * | 1/2012 | Roohparvar et al. | 714/718 |
| 2005/0195653 A1 | 9/2005 | Conley et al. | |
| 2008/0094891 A1 | 4/2008 | Ho et al. | |

* cited by examiner

*Primary Examiner* — Phung M Chung
(74) *Attorney, Agent, or Firm* — Dicke, Billig & Czaja, PLLC

(57) ABSTRACT

Methods of performing an internal diagnostic for a NAND configured memory device include storing data in a data cache coupled to an array of memory cells arranged in a NAND configuration, wherein the data stored in the data cache corresponds to at least one diagnostic function; performing a decode operation on the data stored in the data cache, wherein the decode operation generates a diagnostic function command for testing internal functions of the NAND configured memory device; and providing the decoded diagnostic function command to a state machine of the NAND configured memory device adapted to perform the decoded diagnostic function command.

20 Claims, 9 Drawing Sheets

MACRO AND COMMAND EXECUTION FROM MEMORY ARRAY

RELATED APPLICATIONS

This Application is a continuation of U.S. application Ser. No. 13/651,931, titled "MACRO AND COMMAND EXECUTION FROM MEMORY ARRAY," filed Oct. 15, 2012 (now U.S. Pat. No. 8,543,874), which is a Divisional of U.S. application Ser. No. 13/346,290, titled "MACRO AND COMMAND EXECUTION FROM MEMORY ARRAY," filed Jan. 9, 2012, (now U.S. Pat. No. 8,291,272), which is a Divisional of U.S. application Ser. No. 12/261,857, titled "MACRO AND COMMAND EXECUTION FROM MEMORY ARRAY," filed Oct. 30, 2008, (now U.S. Pat. No. 8,095,834), each of which is commonly assigned and incorporated herein by reference.

TECHNICAL FIELD

The present disclosure relates generally to memory devices and in particular the present disclosure relates to internally executing instructions and commands stored in the array of a memory device.

BACKGROUND

Memory devices are often provided as internal storage areas in electronic devices such as personal computers (PCs), digital cameras and cellular telephones. In general, memory devices contain an array of memory cells for storing data, and row and column decoder circuits coupled to the array of memory cells for accessing the array of memory cells in response to an external address.

One type of memory is a non-volatile memory known as FLASH memory. FLASH memory is a type of EEPROM (electrically-erasable programmable read-only memory) that can be erased and reprogrammed in blocks. Many modern personal computers (PCs) have their BIOS stored on a FLASH memory chip so that it can easily be updated if necessary. Such a BIOS is sometimes called a FLASH BIOS. FLASH memory is also popular in wireless electronic devices because it enables the manufacturer to support new communication protocols as they become standardized and to provide the ability to remotely upgrade the device for enhanced features. FLASH memory typically utilizes one of two basic architectures known as NOR FLASH and NAND FLASH. The designation is derived from the logic used to read the devices.

As with most types of memory, including FLASH memory, it is desirable to test and verify the memory device during the development phase of a device, as part of the manufacturing process of the device and finally by the end user of the memory device.

During the development phase of a memory device, development prototype devices are often made which have additional memory circuitry used to store test instructions and commands. This additional memory circuitry is often hard coded and therefore changing or updating the test instructions and commands can be time consuming and labor intensive. In addition, this additional circuitry can consume large amounts of real estate on a device and therefore must be removed for production versions of the chip.

During the production phase of a memory device, device testing can be tedious and time consuming because the process often requires a test operator utilizing some type of probing device to verify the operation of each memory device. This consumes time and resources which can add up to significant costs. Thus, having the capability of performing self test operations on a memory device would improve time to market, increase production rates and generally reduce the overall cost of memory devices.

For the reasons stated above, and for other reasons stated below which will become apparent to those skilled in the art upon reading and understanding the present specification, there is a need in the art for memory devices to perform self test operations.

DETAILED DESCRIPTION

Figure 1:
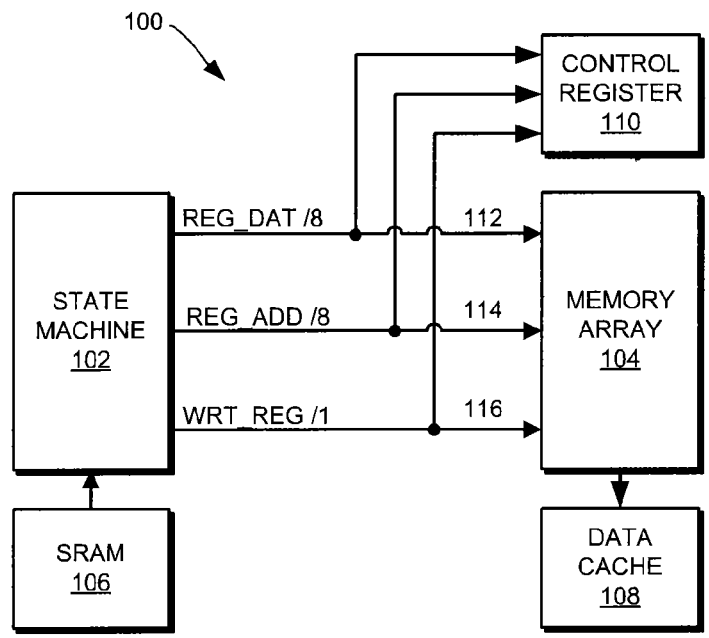
FIG. 1 is a functional block diagram of a prior art memory device utilizing SRAM.

In the following detailed description of the embodiments, reference is made to the accompanying drawings that form a part hereof. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The following detailed description is, therefore, not to be taken in a limiting sense, and the scope of the present disclosure is defined only by the appended claims, along with the full scope of equivalents to which such claims are entitled.

There are many different types of memory including by way of example random-access memory (RAM), read only memory (ROM), dynamic random access memory (DRAM), synchronous dynamic random access memory (SDRAM), and FLASH memory. Most memory devices are comprised of an array of memory cells for storing data permanently (ROM) or temporarily (RAM.) These devices also typically have control circuitry to manage functions required to interact with the memory array. State machines are often utilized to facilitate the operation of the memory device. These state machines often have some type of ROM associated with them.

FIG. 1 illustrates a prior art memory device 100 having a state machine 102, an array of memory cells 104, SRAM 106, a data cache 108 and a control register 110. The memory device in FIG. 1 also contains a Register Data ('REG_DAT') 112 bus, a Register Address ('REG_ADD') 114 bus and a Write Register ('WRT_REG') 116 signal. The memory device 100 in FIG. 1 utilizes SRAM 106 to store test instructions and commands. These test instructions and commands are then used by the state machine 102 such as during the development phase of a memory device. Utilizing SRAM 106 to provide the test instructions and commands to the state machine 102 is only practical in test and development chips due to the large amount of real estate on the die that SRAM 106 consumes which therefore destroys the array efficiency of the chip.

Figure 2:
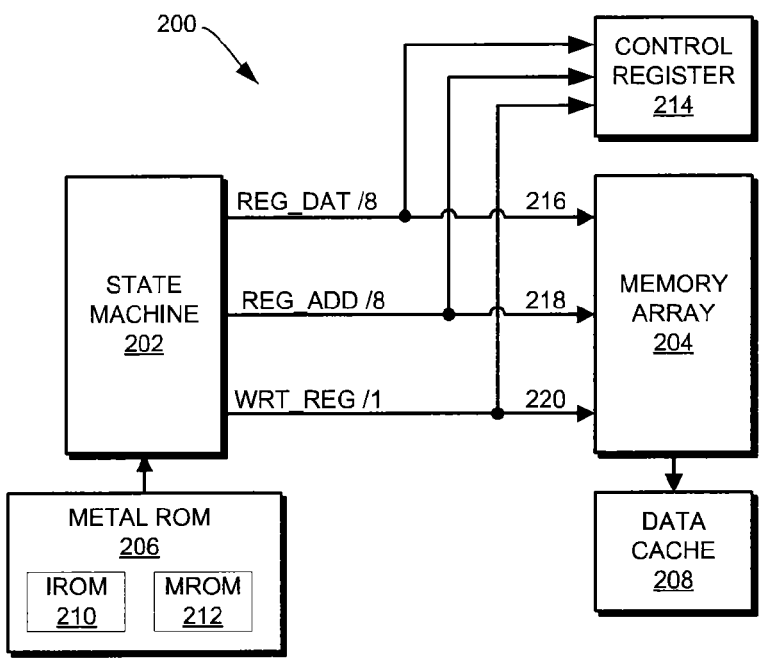
FIG. 2 is a functional block diagram of a prior art memory device utilizing metal ROM non-volatile memory.

FIG. 2 illustrates a prior art memory device 200 having a state machine 202, a memory array 204, non-volatile metal ROM 206 that includes instruction ROM ('IROM') 210 and macro ROM ('MROM') 212, a data cache 208 and a control register 214. The memory device 200 also contains a register data 216 bus, a register address 218 bus and a write register 220 signal. The IROM 210 might store instructions that direct the state machine 202 on how to apply macros to carry out a desired algorithm or function. Macros are typically lower level internal instructions such as a particular series of individual register manipulations to be performed. Functionality of memory devices is often effectuated by setting register values in the device which in turn control the operation of the device. These device control registers are often located in what is known in the art as a control register 214. Macros are typically stored in the MROM 212. Upon receiving a valid command, the state machine 202 typically loads instructions from the IROM 210 along with macros from the MROM 212. During the development phase of a memory device, these instructions and macros may be programmed into the IROM 210 and MROM 212 to help facilitate testing and operation of the new device. During the production phase, the IROM 210 and MROM 212 might be programmed with instructions and macros used by the device 200 while in normal operation.

Currently, if a change in the IROM 210 or MROM 212 is needed or desired, a new metal mask must be created and used to fabricate a new run of devices. Implementing these metal mask changes to make changes to the IROM 210 and MROM 212 can be time consuming and expensive.

Embodiments of the present disclosure allow for immediate implementation of test instructions, commands or macro changes because metal mask changes to the IROM 210 and MROM 212 are no longer required. Embodiments of the present disclosure also reduce or eliminate the array efficiency destroying characteristic of utilizing real estate consuming SRAM 106 to store test instructions and commands for use by the state machine 102.

Figure 3:
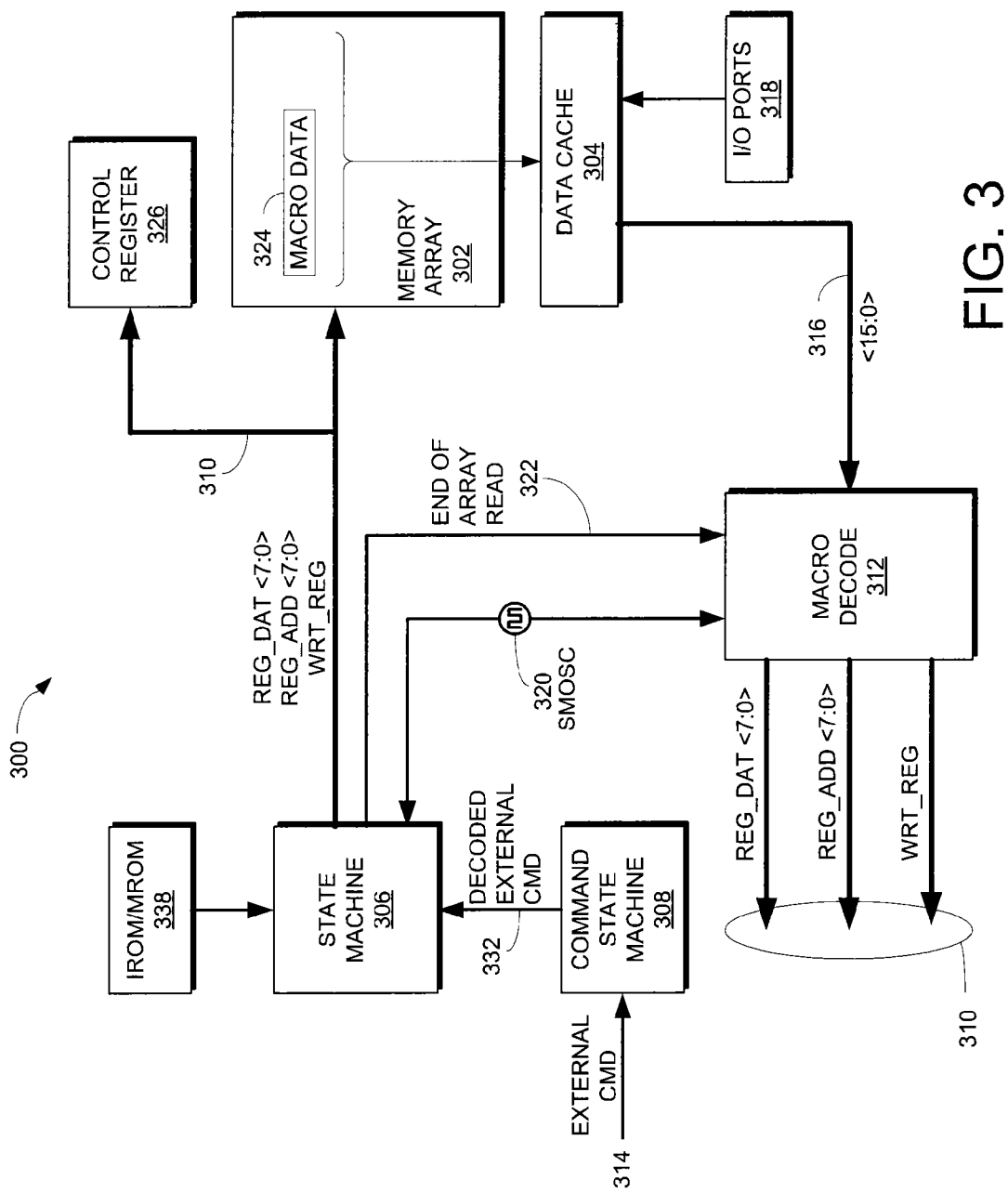
FIG. 3 is a functional block diagram representation of executing a macro from a memory array according to one embodiment of the disclosure.

FIG. 3 illustrates a memory device 300 adapted to perform a "Macro Execution" function according to one embodiment of the present disclosure. The memory device 300 has been simplified to focus on the embodiments of the present disclosure. Memory device 300 is comprised of a command state machine 308, a state machine 306, a data cache 304, internal busses and signals 310, a macro decode block 312, a control register 326, IROM/MROM 338, and an array of memory cells 302.

Memory device 300 can have one or more arrays of FLASH memory cells 302. Embodiments of the present disclosure however are not limited only to FLASH memory. The memory array 302 may be organized in multiple banks of memory cells. The memory cells of the memory array 302 are arranged in rows and columns and also may be arranged in either a NAND or a NOR configuration as is known to those skilled in the art. The memory cells of the memory array 302 may be multilevel memory cells, single level memory cells or a combination of both. Multilevel memory cells take advantage of the analog nature of a traditional FLASH cell by assigning a data state (e.g., as represented by a bit pattern) to a specific range of threshold voltages stored on the cell. Various embodiments of the present disclosure can store macro and operation code ('op code') data in memory cells adapted to operate as a single level memory cell. Single level memory cells are typically more reliable and thus well suited to store data where data integrity and reliability is important.

According to an embodiment of the present disclosure illustrated in FIG. 3, data is stored in the array of memory cells 302 at predetermined locations wherein the data corresponds to one or more macros 324. The macro data stored in the array 324 can be loaded as part of the component manufacturing process and can be comprised of array maintenance, verification and testing macros.

The state machine 306 and the command state machine 308 may be separate functional blocks or may be combined into a single functional state machine in the memory device 300. The state machine 306 manages the internal operations of the memory device. For example, external commands 314 are received (e.g. from a host processor) and decoded by the command state machine 308. The command state machine 308 provides these decoded commands 332 to the state machine 306. The state machine 306 then manages the execution of the intended internal operation(s) corresponding to the received command 314. For example, a command 314 of '0xbf' might be decoded as an instruction to the state machine 306 to read macro data 324 stored at a predetermined location in the memory array 302. Other commands 314 might be decoded into different internal operations to be performed. The embodiment is not limited to the commands discussed here. One skilled in the art could assign various commands to be decoded into internal operations to be performed by the state machine 306.

The state machine 306 according to the embodiment of FIG. 3 is coupled to internal data buses 310. For example, the state machine 306 can be coupled to the Register Data bus ('REG_DAT <7:0>') and Register Address bus ('REG_ADD <7:0>') 310. The state machine 306 may also be connected to various signals present in the memory device 300. For example, state machine 306 may be coupled to a Write Register ('WRT_REG') signal 310. State machine 306 may also be coupled to a state machine oscillator 'SMOSC' 320 (e.g. clock signal.) State machine 306 may also generate an End of Array Read signal 322 upon completion of a read operation. The End of Array Read signal 322 can serve as a Macro Decode Enable signal according to some embodiments of the present disclosure. Other signals may be present in the various embodiments of the present disclosure as are known to those skilled in the art.

The data cache 304 of FIG. 3 is comprised of a primary data cache (PDC) and a secondary data cache (SDC.) The data cache acts to latch data read from the array of memory cells 302. The data cache 304 can also be loaded directly through input/output (I/O) signals 318 of the memory device. This allows for data to be loaded directly into the data caches 304 without having to perform a read operation of the memory array 302. A typical size of the primary and secondary data caches is 4K bytes.

The control register 326 is comprised of address and data registers used in the operation of the memory device 300.

Different operations and functions can be effectuated in the memory device 300 by writing data to the registers of the control register 326 by utilizing the data signals 310.

The macro decode block 312 is coupled to the data cache 304 through a plurality of signals 316. Signals coupling the macro decode block 312 and the data cache 304 may be a 16 bit wide data bus as illustrated in FIG. 3. Other bus 316 widths are possible in the various embodiments of the present disclosure. The macro decode block 312 is also coupled to internal busses and signals 310 of the memory device 300. For example, the macro decode block 312 is coupled to the Reg_dat, Reg_add, Wrt_reg, SMOSC 320 and End of Array Read 322 signals. The macro decode block 312 reads data latched in the data cache 304 and decodes the data into a form wherein the macro(s) can be executed by the state machine 306. As discussed above, the data cache 304 can be loaded with macro data stored in predetermined locations of the memory array 324 or loaded through the I/O signals 318 of the memory device 300. This flexibility is particularly helpful during development and debugging phases of the memory device.

During operation of the memory device 300, the command state machine 308 may receive an external command 314 corresponding to an instruction to execute at least one macro stored at a predetermined location 324 of the memory array 302. The stored macros 324 can reside at predetermined locations that may or may not be contiguous locations in the memory array 302. In response to an external command 314 decoded by the command state machine 308, the state machine 306 asserts control of the Register Address and Register Data busses and Write Register signal 310 and performs a read operation of the macro data stored in the predetermined locations 324 of the memory array 302. The read operation managed by the state machine 306 transfers data stored in the memory array 302 and copies it into the data cache latches 304. Other commands 314 can be received and decoded by the command state machine 308. Upon the completion of the read operation to transfer the desired macro data stored in the memory array 302 into the data cache 304, the state machine 306 releases control of the Register Address and Register Data busses and the Write Register signal 310 and asserts the End of Array Read signal 322. The End of Array read signal 322 also serves to enable the Macro Decode block 312. In one embodiment of the present disclosure, a rising edge of the SMOSC signal 320 directs the macro decode block 312 to read data stored in the data cache latches 304 and place the decoded macro data on the Register Data and Register Address busses 310. A falling edge of the SMOSC signal 320 triggers a transition of the Write Register signal to cause the Register Data and Register Address data to be latched in the control register 326. Operations within the memory device 300 are conducted in part by writing particular data to the registers of the control register 326. The status of the registers in the control register 326 control operation of the memory device 300. Other latching and triggering schemes are known to those skilled in the art.

Figure 4:
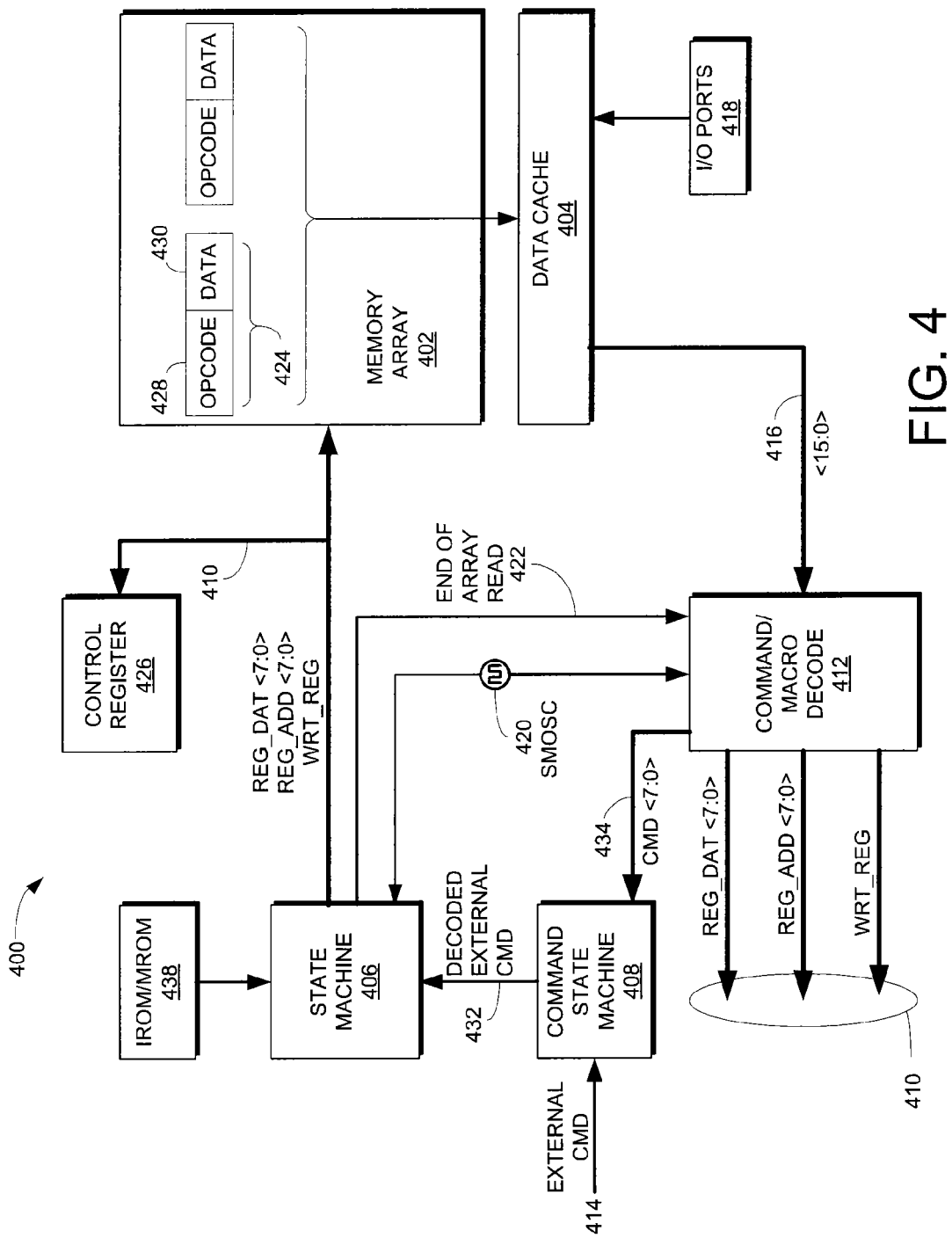
FIG. 4 is a functional block diagram representation of executing a command and macro from a memory array according to one embodiment of the disclosure.

FIG. 4 illustrates an alternate embodiment of a memory device 400 according to the present disclosure which illustrates a "Command and Macro Execution" function. The embodiment shown in FIG. 4 is similar to that of the embodiment of FIG. 3. However, the embodiment of FIG. 4 also shows a command, in this case op code data 428 (sometimes referred to simply as "op code(s)"), stored along with associated macro data 430 in predetermined locations 424 of the memory array 402. The op code data 428 acts as a header for the macro data 430 associated with it. Embodiments of the present disclosure are not limited to command and macro data being stored in contiguous locations of memory. For example, some or all of the op codes can be stored in one part of the array and some or all of the associated macro data can be stored in a different location. The memory device 400 has been simplified to focus on the embodiments of the present disclosure.

Memory device 400 is comprised of a command state machine 408, a state machine 406, a data cache 404, internal busses and signals 410, a Command/Macro Decode Block 412, a control register 426, MROM/IROM 438 and an array of memory cells 402. Memory device 400 is further comprised of an additional Command Bus 434. The command bus 434 is not limited to any one bus width.

The Command/Macro Decode Block 412 takes data latched in the data cache 404 during a read operation and places the information on the Register Data and Register Address busses 410 according to a predetermined process.

An external (e.g. host) command 414 may be received and decoded by the command state machine 408 and is provided to the state machine 406 as a decoded state machine command 432. The command state machine 408 and the state machine 406 can be separate functional blocks or can be combined into a single state machine functional block. The state machine 406 manages the intended external command 414 in response to receiving the decoded state machine command 432. For example, an external command 414 of 0xbf corresponding to a 'read command and macro' operation might be received and decoded by the command state machine 408. The state machine 406, upon receiving the decoded 'read command and macro' operation instruction 432 takes control of the Register Data and Register Address busses along with the Write Register signal 410. The state machine 406 then performs a read operation of a predetermined location 424 of memory 402 and transfers the op code 428 and macro data 430 into the data cache latches 404. Upon completion of the current read operation, the state machine 406 releases control of the Register Data and Register Address busses and the Write Register signal 410 and asserts the End of Array Read 422 signal.

The assertion of the End of Array Read signal 422 also serves to enable the Command/Macro Decode Block 412. The Command/Macro Decode Block 412 asserts control over the Register Data and Register Address busses and Write Register signal 410 in a similar manner as described in the embodiment of FIG. 3. As in the embodiment of FIG. 3, a rising edge of the SMOSC signal 420 instructs the Command/Macro Decode Block 412 to put decoded data read from the data cache 404 on the Register Data and Register Address busses 410. A falling edge of the SMOSC signal 420 triggers a transition of the Write Register signal that causes the Register Data and Register Address data to be latched in the control register 426. The Command/Macro Decode Block 412 can take data from the data cache 404 and place the data directly on the Register Address and Register Data busses or additional processing of the data can occur prior to placing it on the Register Data and Register Address busses. In addition to taking control of the Register Data and Register Address busses 410, the Command/Macro Decode block 412 can also take control of an additional command bus 434 of the memory device 400. This command bus 434 provides decoded op codes to the command state machine 408 that have been decoded by the Command/Macro Decode Block 412. The decoded op codes on the command bus 434 can indicate the next operation to be performed by the state machine 406. Table 1 lists for illustration only and not by way of limitation examples of op codes along with a corresponding operation to be performed by the state machine 406.

TABLE 1

| Op Code | Operation/Instruction |
| --- | --- |
| 0000 | Register_data |
| 0001 | Register_address |
| 0010 | Write_command |
| 0011 | Write_address |
| 0100 | Write_data |
| 0101 | Wait for Ready/Busy_ |
| 0110 | Read Next Page |
| 0111 | Delay/Wait |
| 1010 | Exit/End execution from array |

The embodiment of FIG. 4 decodes the op codes and provides an indication to the state machine 406 as to what is to be done, if anything, with the macro data following the op code. For example, data stored in a predetermined location 424 of the memory array may be comprised of '0011 1010 1011'. In this example, the first four bits comprise the op code 428 corresponding to a "Write_address" command as indicated in Table 1. The remaining eight bits of data 430 are the binary representation of the hexadecimal value of 0xAB (1010 1011.) Thus, in the present example, data '0011 1010 1011' having been read from the memory array 402 and processed by the Command/Macro Decode Block 412, triggers the state machine 406 to write a value of 0xAB into the address register of the control register 426. In another example, data bits '0110 1010 1011' read from the memory array 402 and processed by the Command/Macro Decode Block 412 triggers the state machine 406 to perform a read operation of another page from the memory array 402 starting at address 0xAB. The data stored at location 0xAB in the present example can be comprised of additional command and macro data, macro data alone or neither command nor macro data. An additional command (e.g., op code '1010' shown in Table 1) can be assigned as an 'exit' command which triggers the state machine 406 to cease reading and executing commands and macros from the memory array 402. Op codes and their corresponding instructions according to the various embodiments of the present disclosure are not limited to those provided in Table 1. Other variations of op codes and corresponding instructions are known to those skilled in the art.

As with other embodiments of the present disclosure, the embodiment of FIG. 4 also provides for loading the data cache 404 directly from I/O ports 418 of the memory device 400. This bypasses the need to perform a read operation of the memory array 402 to load data into the data cache 404.

Figure 5:
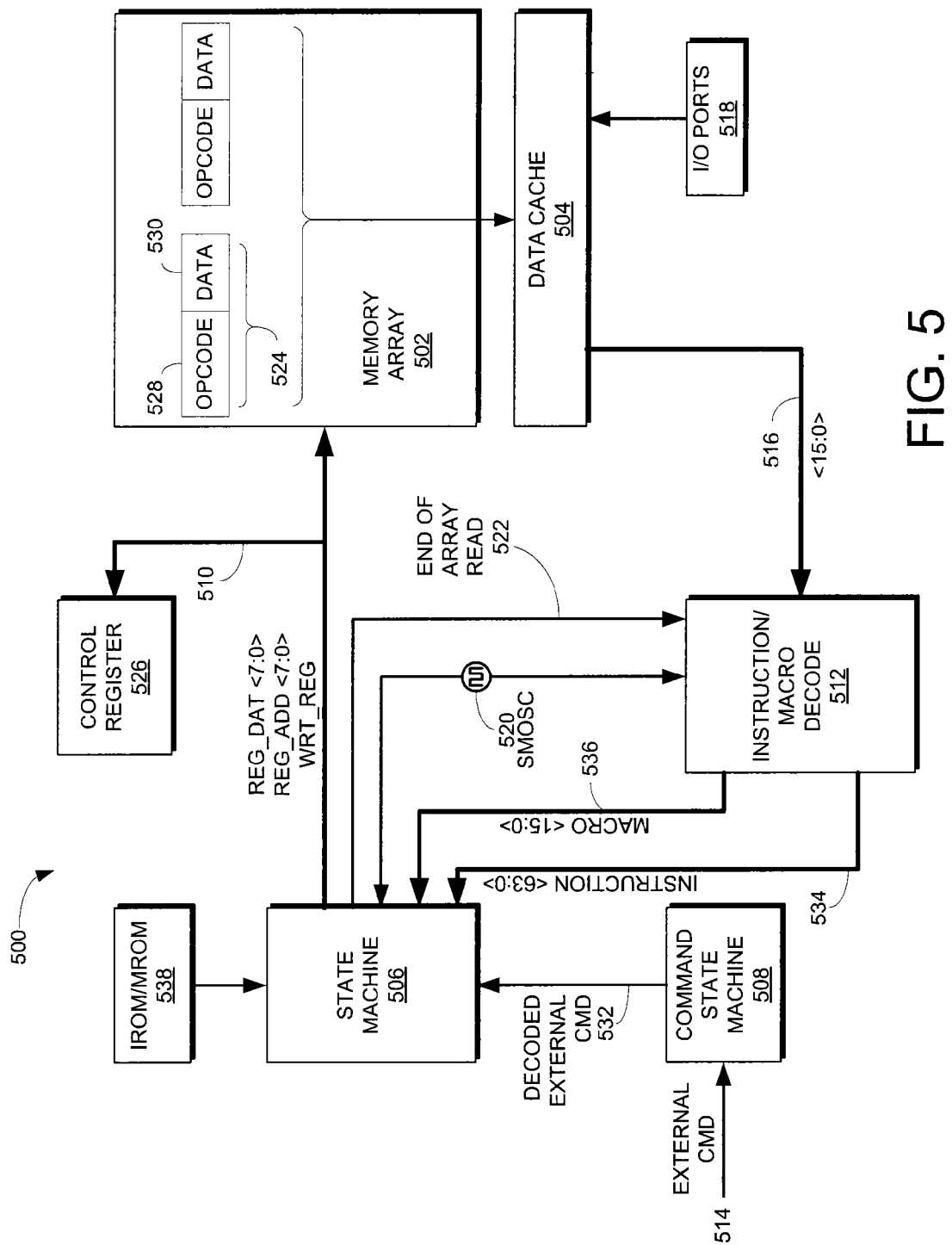
FIG. 5 is a functional block diagram representation of executing an internal instruction and macro from a memory array according to one embodiment of the disclosure.

FIG. 5 shows a memory device 500 adapted to execute an "Internal Instruction and Macro Execution" operation according to another embodiment of the present disclosure. An internal instruction according to the present embodiment differs from a command as illustrated in the embodiment of FIG. 4 in that a command indicates a task to perform with the macro data that follows the command. For example, the commands given in Table 1 indicate what the state machine 406 is to do with the data that follows the command. An internal instruction as shown in the embodiment of FIG. 5 relates to instructions used by the state machine 506 to determine the order of implementation of the macros stored 530 in the memory array. The macros, commands and associated macros and instructions and associated macros can be of a user mode command type or a test mode command type. Typically, test mode commands are unique commands which are only known to or usable by the manufacturer during production.

Memory device 500 comprises a command state machine 508, a state machine 506, a data cache 504, internal busses and signals 510, an Instruction/Macro Decode Block 512, a control register 526, IROM/MROM 538 and an array of memory cells 502. Memory device 500 further comprises an instruction bus 534 and macro bus 536. The bus widths of the instruction bus 534, macro bus 536 and the Register Data and Register Address busses 510 are not limited to any one fixed bus width.

Upon receiving a valid command, the state machine 506 typically loads instruction data from the IROM along with macro data from the MROM 538. Similar to embodiments of the present disclosure illustrated in FIGS. 3 and 4, the embodiment of FIG. 5 also is adapted to receive an external command 514. This external command 514, according to one embodiment of the present disclosure, may be a command which directs the state machine 506 not to load instructions or macros from the IROM/MROM 538 (e.g. after power up.) This can be desirable in a production or development testing phase of a memory device 500. This can also be beneficial during the production of a memory device wherein test data and routines (e.g., diagnostic functions) can be programmed into the memory array 502 to test the various internal functions of the memory device 500. Once the device has passed the production test routines executed from the memory array, the instruction data and macro data can be erased from the memory array. The memory device 500 can then be commanded to resort back to executing instructions and macros from the IROM/MROM 538 upon receiving a valid command, for example.

Again, similar to the embodiments of the present disclosure as illustrated in FIGS. 3 and 4, the command state machine 508 decodes an external (e.g. host) command 514 and provides it 532 to the state machine 506. The state machine 506 can assert control of the Register Data and Register Address busses and Write Register signal 510 and execute a decoded external command 532. For example, a read command can be performed that reads an op code 528 and associated data 530 stored in a predetermined location 524 of the memory array 502 and transfers the information to the data cache 504. Upon completion of the read operation, the state machine 506 releases control of the Register Data and Register Address busses and Write Register signal 510 and asserts the End of Array Read signal 522. The assertion of the End of Array Read signal 522 serves as an enable signal to the Instruction/Macro Decode Block 512. The Instruction/Macro Decode Block 512 then reads the data latched in the data cache 504. As with other embodiments of the present disclosure, data can be manually latched into the data cache 504 from I/O ports 518 of the memory device thereby eliminating the need to perform a read operation of the memory array 502. Again, this is particularly advantageous during development and debugging phases of the memory device.

The Instruction/Macro Decode Block 512 is coupled to the data cache 504 by a data bus 516 to allow for the transfer of data from the data cache 504 to the Instruction/Macro Decode Block 512. In the embodiment of FIG. 5, the data bus 516 is shown as 16 bits wide. Other data bus 516 widths are possible according to the various embodiments of the present disclosure.

Once data latched in the data cache 504 has been read by the Instruction/Macro Decode Block 512, the decode block performs a decode operation on the information to transform it into Instruction Data and Macro Data. This instruction data and macro data is put on the instruction data bus 534 and macro data bus 536, respectively. In one embodiment, the Instruction Data and Macro Data are decoded into a format that mimics the format of instruction data and macro data stored in the IROM/MROM 538. By mimicking the format of the data stored in IROM/MROM 538 the state machine 506 does not need to be adapted to interpret multiple formats of instruction data and macro data. Instead, the state machine 506 only requires instruction to either obtain instruction and macro data from the IROM/MROM 538 or the from the memory array 502. The embodiment of FIG. 5 illustrates an instruction data bus 534 that is 64 bits wide and a macro data bus 536 that is 16 bits wide. Various embodiments of the present disclosure are not limited to these bus widths. Additionally, embodiments of the present disclosure allow for the variation of the sizes of memory array space occupied by op code 528 and macro data 530 stored in the memory array 502. A trim value can be utilized that indicates the transition between op code data 528 and macro data 530 stored in a given location 524 in the memory array 502. For example, an op code 528 and the associated macro data 530 stored in the memory array 502 may be comprised of 12 bits. A trim value can indicate that the first four bits are op code data 528 and the remaining 8 bits are macro data 530. Other trim values are possible according to the various embodiments of the present disclosure.

The embodiment of FIG. 5 also illustrates an End of Array Read signal 522 and a SMOSC signal 520. As with previous embodiments of the present disclosure, the End of Array Read signal can serve as an enable signal to the Instruction/Macro Decode Block 512. Once enabled, the Instruction/Macro Decode Block 512 reads data latched in the data cache 504 and according to one embodiment, decodes the data read from the data cache 504 into instruction data and macro data that is then placed on the instruction bus 534 and macro bus 536. In the present embodiment illustrated in FIG. 5, one transition of the SMOSC 520 signal triggers the Instruction/Macro Decode Block 512 to read data latched in the data cache 504 and another transition of the SMOSC signal 520 causes decoded instruction data and macro data to be placed on the instruction bus 534 and the macro bus 536.

Figure 6:
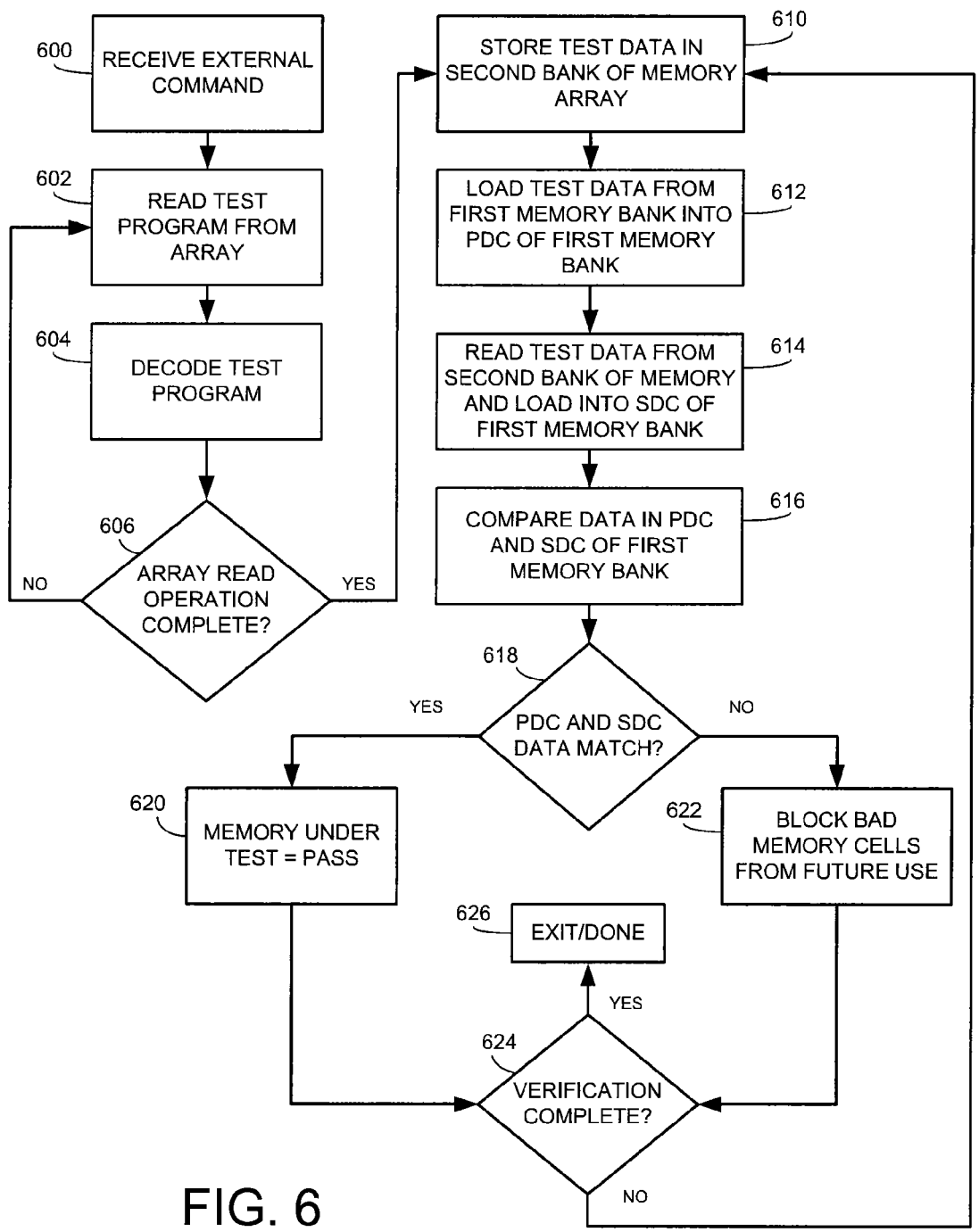
FIG. 6 is a flow chart of a method for testing memory cells of a memory device having a multiple bank architecture according to an embodiment of the present disclosure.

FIG. 6 illustrates a method of performing an internal operation (e.g., self test and/or functional operation) on a multi-bank architecture memory device according to one embodiment of the present disclosure. The flow chart illustrated in FIG. 6 applies to a memory device having two or more banks of memory cells. Each bank of memory cells of the memory array has its own data cache associated with it. Each data cache of the present embodiment also contains a PDC and an SDC, each comprised of a plurality of data latches. In one embodiment the PDCs and SDCs have an equal number of latches. Various embodiments of the present disclosure are not limited to PDCs and SDCs comprising equal numbers of latches.

A test program along with test data is loaded into the first bank of memory cells. The test program can include macros, commands and instructions as discussed previously. The test program provides the macros, commands, and/or instructions for the state machine of the memory device to perform the testing operation using the test data stored along with the test program.

Upon receiving a command 600 (e.g. external host command) to perform a test operation, the state machine of the memory device performs a read operation of the test program stored in the memory array 602. The test program read from the memory array can be processed by a macro decode block 312, a command/macro decode block 412 or an instruction/macro decode block 512 according to the various embodiments of the present disclosure and as illustrated in FIGS. 3, 4 and 5. The read operation 602 and decode operation 604 operation are repeated as long as decision block 606 indicates that the array read operation has not been completed. When the current read operation is complete as determined in decision block 606, the decoded test program 604 can instruct the state machine to load test data stored in the first bank of memory cells into all or a part of the second bank of memory cells 610. In alternate embodiments of the present disclosure, test data may have been loaded into the first or second bank of memory during a previous operation. The test data stored in the first bank of memory cells is loaded (e.g. by performing a read operation carried out by the state machine) into the PDC of the first bank of memory cells 612. The test data loaded into the PDC 612 is the expected data for the current test procedure being performed.

Data from the second bank of memory cells is then loaded (e.g. by performing a read operation carried out by the state machine) into the SDC of the first bank of memory cells 614. The test data read from the second bank of memory cells and loaded into the SDC of the first bank of memory cells is the data to be verified (e.g. data under test.) A comparison 616 of the test data loaded into the PDC of the first bank of memory cells is made with the test data loaded in the SDC of the first bank of memory cells. If the data in the PDC and the SDC matches 618, the memory cells under test from the second bank of memory cells pass the current test 620. If a mismatch is detected, the memory cells of the second bank of memory cells associated with the mismatched data can be marked as defective and blocked from future use 622. If the test procedure is complete 624, the state machine exits the test operation 626. If additional memory needs to be tested, the test procedure continues by repeating the test procedure 610.

The verification method according to the present disclosure may be repeated wherein the test data is inverted in order to detect any defective memory cells that always read back at a fixed value. For example, for the first test run, data such as '1010' can be used. For the second run of the test, data such as '0101' can be used. This allows for testing of multiple possible data states in the memory device. Other patterns of data may be used according to the various embodiments of the present disclosure. Such patterns may be utilized to test memory devices that are configured to operate as single level memory cells, multi-level memory cells or a combination thereof.

Once all the memory cells of the second bank of memory cells have been tested 626, the process may be repeated wherein the second bank of memory cells and its associated data cache (e.g. PDC and SDC) is now used to test the first bank of memory cells. This testing method can be expanded to test memory devices having more than two banks of memory cells.

Figure 7:
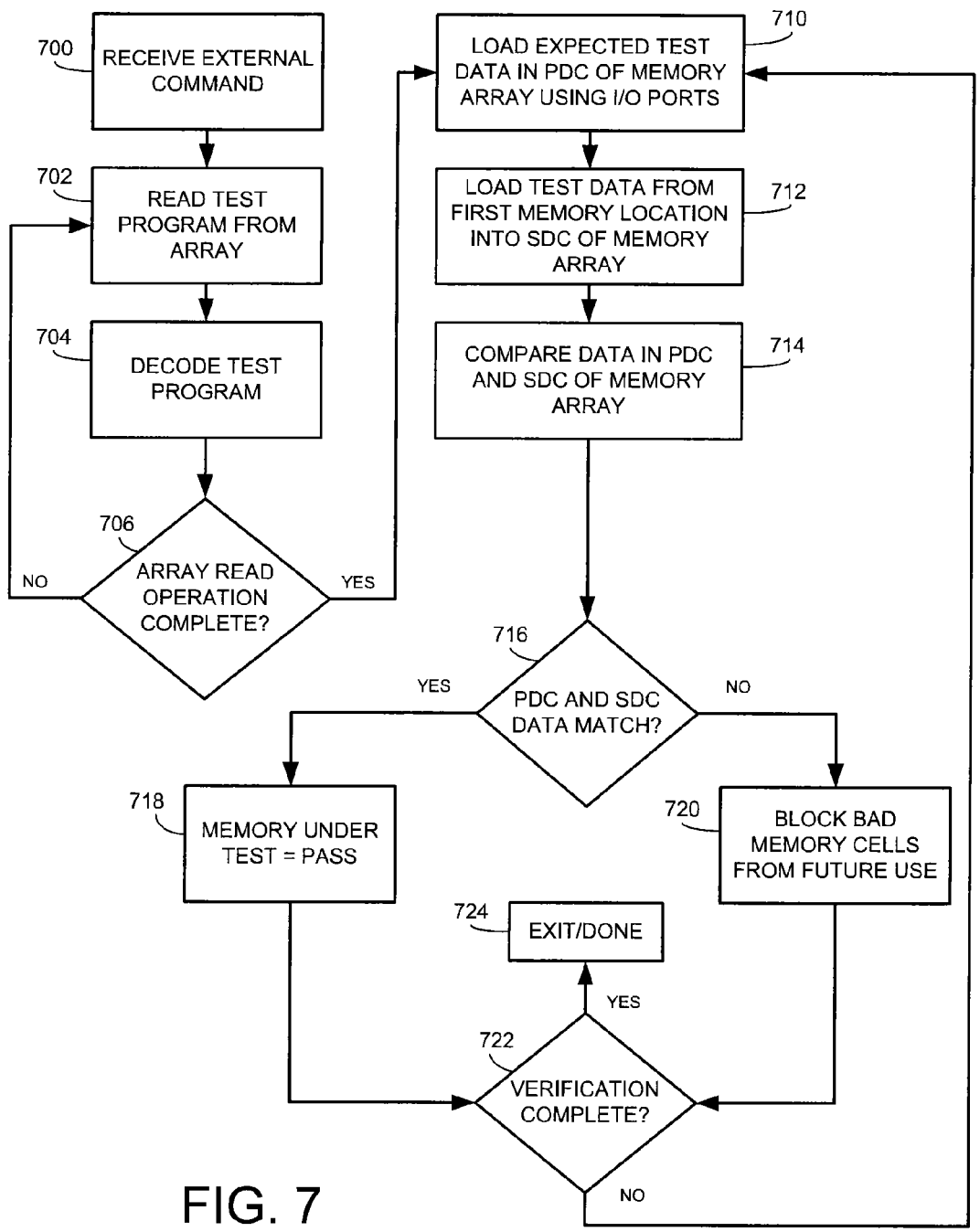
FIG. 7 is a flow chart of a method of testing memory cells of a memory device having a single bank architecture according to an embodiment of the present disclosure.

FIG. 7 illustrates a test method of a memory device having a single memory bank architecture according to another embodiment of the present disclosure. According to the present embodiment, a test program and test data is loaded into part or all of the single bank of memory. Expected test data in this embodiment of the present disclosure can be loaded into the PDC through the I/O ports of the memory device 710. Upon receiving a command 700 (e.g. external host command), the state machine performs a read operation of the single bank of memory of the memory device 702. The test program read from the memory array is processed by a macro decode block 312, a command/macro decode block 412 or an instruction/macro decode block 512 according to the various embodiments of the present disclosure and as illustrated in FIGS. 3, 4 and 5. The read operation 702 and decode operation 704 operation are repeated as long as decision block 706 indicates that the array read operation has not been completed. Once the read operation of the memory array is complete as determined in decision block 706, expected test data is loaded into the PDC through the I/O ports of the memory device 710. Test data previously stored and read from memory cells of the memory array is loaded into the SDC 712. A comparison 714 is made of the expected data loaded into the PDC through the I/O ports and the data loaded into the SDC read from the memory array. This comparison 716 is performed to detect any defective memory cells in the array. Memory cells that are determined to be defective can be blocked from future use by the memory device 720. Memory cells whose test data stored in the SDC matches the expected data in the PDC pass the verification test 718. The method of the present embodiment is not limited to expected data being stored in the PDC and data under test stored in the SDC. For example, the expected data loaded through the I/O ports might be loaded into the SDC and the data read from the memory device might be loaded into the PDC.

Again, the verification method according to the present disclosure and illustrated in FIG. 7 may be repeated wherein the test data is inverted in order to detect any defective memory cells that always read back at a fixed value. For example, for the first test run, data such as '1010' can be used. For the second run of the test, data such as '0101' can be used. This allows for testing of multiple possible data states in the memory device. Other patterns of data can be used according to the various embodiments of the present disclosure. Such patterns may be utilized to test memory devices that are configured to operate as single level memory cells, multi-level memory cells or a combination thereof. When the current testing operation is complete as determined in decision block 722, the process ends 724.

Figure 8:
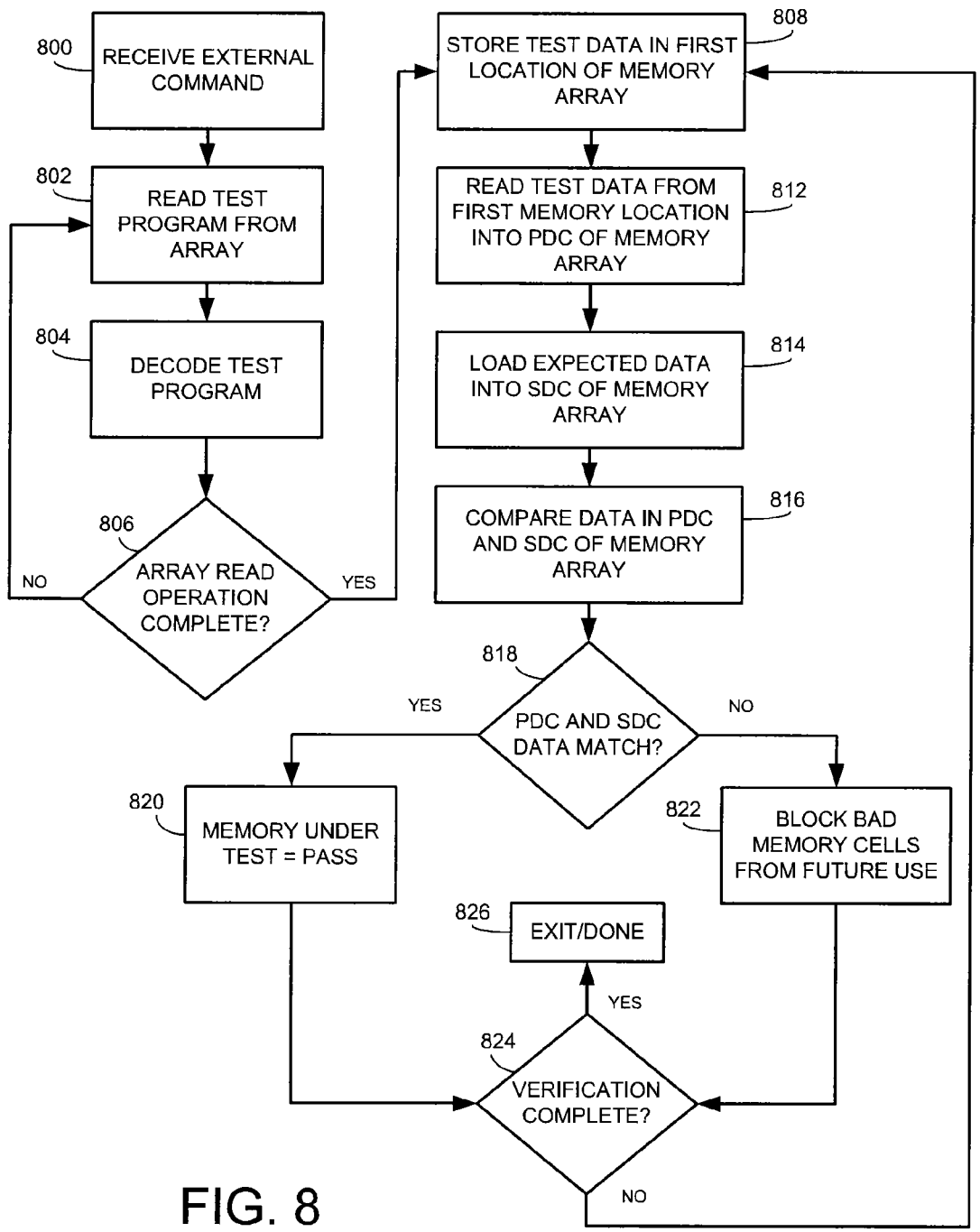
FIG. 8 is a flow chart of a method for testing memory cells of a memory device having a single bank architecture according to another embodiment of the present disclosure.

FIG. 8 illustrates another test method of a memory device according to an embodiment of the present disclosure having a single bank of memory cells. As discussed with respect to other embodiments of the present disclosure, a test program and test data is loaded into the memory array of the memory device. Upon receiving a command 800 (e.g. external host command), the state machine performs a read operation 802 of the location in the memory wherein the test program is residing. A decode operation is performed 804 on the data read from the memory array. The test program read from the memory array can be processed by a macro decode block 312, a command/macro decode block 412 or an instruction/macro decode block 512 according to the various embodiments of the present disclosure and as illustrated in FIGS. 3, 4 and 5. The read operation 802 and decode operation 804 operation are repeated as long as decision block 806 indicates that the array read operation has not been completed. Upon completion of the read operation of the memory array as determined in decision block 806, the state machine loads test data that was previously stored in the memory array into a first location in the memory array to be tested 808. The test data loaded into the memory array may fill the remainder of the memory device with test data or only a portion of the memory device may be loaded with test data. Test data is then read from the memory array and loaded into the PDC of the memory array 812. Test data comprising expected data previously loaded along with the test program is then read and loaded into the SDC of the memory array 814. A comparison of the data in the PDC and SDC is performed 816. The data stored in the PDC and SDC, when compared, should be equal assuming no errors occurred in the read operation due to defective memory cells under test. A match of the data stored in the PDC and SDC indicates a "Pass" result for the memory under test 820. Bad memory cells identified during the comparison 818 are blocked from future use 822. The test program is repeated until all memory cells in the array have been tested 824 at which point the process ends 826.

As discussed regarding other embodiments of the present disclosure, the test procedure may be repeated using inverted data and additional data patterns may be utilized to test memory cells adapted to perform as single or multi level cells. Other embodiments may restrict that memory cells used to store test programs and test data are only operated as single level memory cells due to the improved reliability of single level cells over cells configured to operate as multi-level cells. The locations of bad memory cells identified during performance of the test programs 822 according to embodiments of the present disclosure can be stored in the memory array. Then, as part of a power up procedure of the memory device, the locations of these bad memory cells can be read from the array to prevent their use by the memory device during normal operation.

Figure 9:
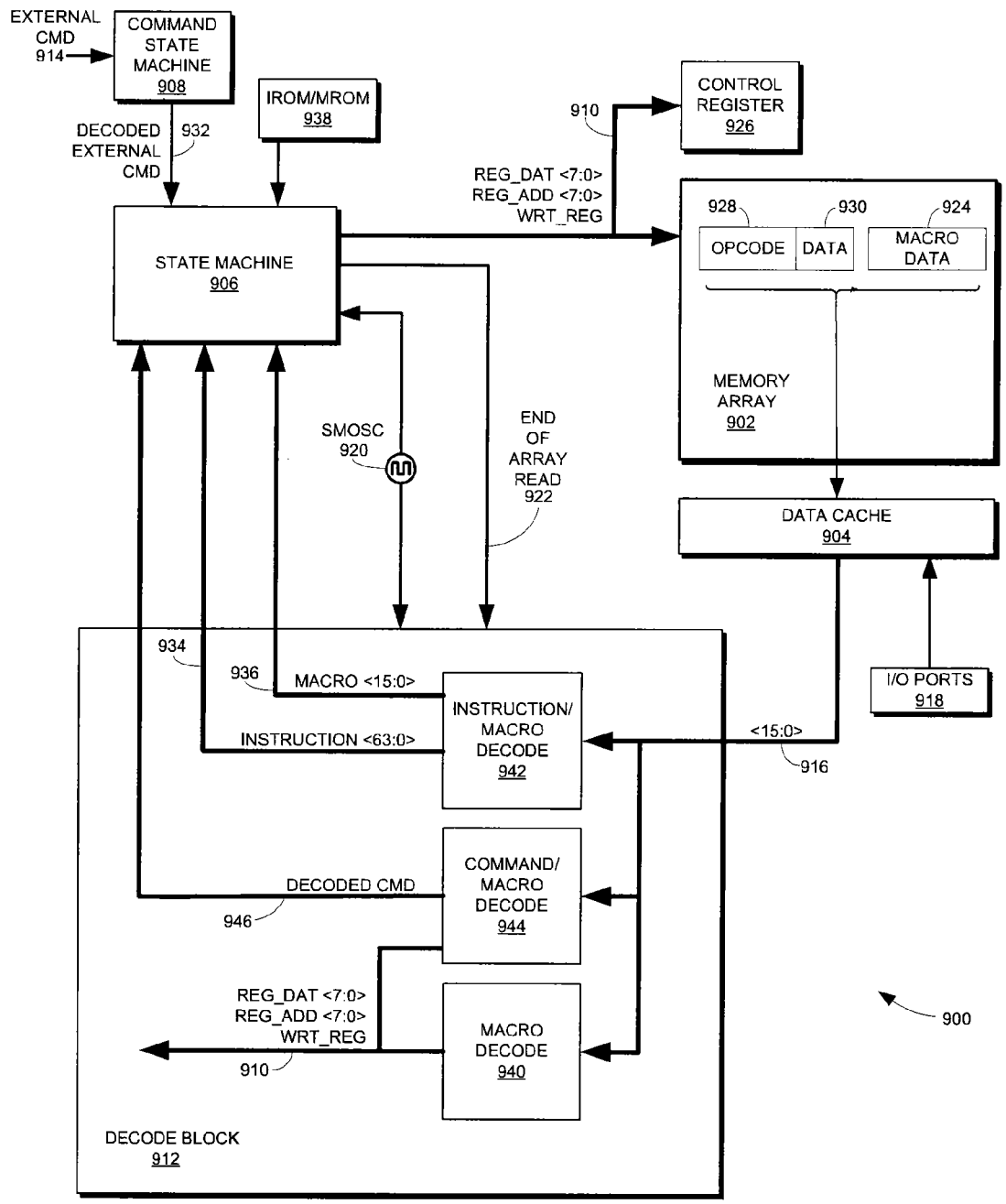
FIG. 9 is a functional block diagram representation of a memory device incorporating multiple embodiments of the present disclosure.

FIG. 9 shows an embodiment of the present disclosure having memory device 900 adapted to perform multiple tasks, for example those of multiple other embodiments. The memory device 900 shares many similarities with previous embodiments shown in FIGS. 3, 4 and 5. A data bus 916 having a bus width of 16 bits couples the decode block 912 and the data cache 904. Other bus widths are possible as is known in the art. The decode block 912 comprises a Macro Decode Block 940, a Instruction/Macro Decode Block 942 and a Command/Macro Decode Block 944. The decode block 912 may be comprised of a plurality of state machines to implement the Macro Decode 940, Instruction/Macro Decode 942 and the Command/Macro Decode 944 Blocks. Alternate embodiments allow for a single state machine adapted to incorporate the three decode blocks 940, 942 and 944. A received external command 914 (e.g. external host command), when decoded 932, provides an indication as to which decode block (e.g. 940, 942, 944) is to be utilized. Additional embodiments allow for macros 924, op codes 928 and data 930 read from the memory array 902 to provide an indication as to which decode block functionality is to be utilized.

FIG. 9 further illustrates that an external command 914 can be received and decoded by a command state machine 908 which is then provided to the state machine 906 as a decoded state machine command 932. The command state machine 908 and the state machine 906 can be separate functional blocks or can be combined into a single state machine functional block. IROM/MROM 938 is also shown coupled to state machine 906 along with the SMOSC 920 signal. The End Of Array Read signal 922 generated by the state machine 906 also serves as an enable signal for the decode block 912. The Register Data, Register Address and Write Register signals, collectively represented at 910 in FIG. 9, are coupled to the state machine 906, the command/macro decode block 944, control register 926 and macro decode block 940. The I/O ports 918 allow for direct access to the data cache 904 according to the various embodiments of the present invention. The command/macro decode block provides a decoded command 946 to the state machine 906 as discussed in regards to the embodiment of FIG. 4. Decoded instruction 934 and macro 936 data are also provided to the state machine 906 as discussed according to the embodiment of FIG. 5

Various bus widths are illustrated in FIG. 9. For example, the decoded instruction bus 934 is shown in FIG. 9 to be 64 bits wide. However, the embodiments of the present disclosure are not restricted to the bus widths shown in FIG. 9. As is known in the art, bus widths can be adjusted to fit a particular application.

Figure 10:
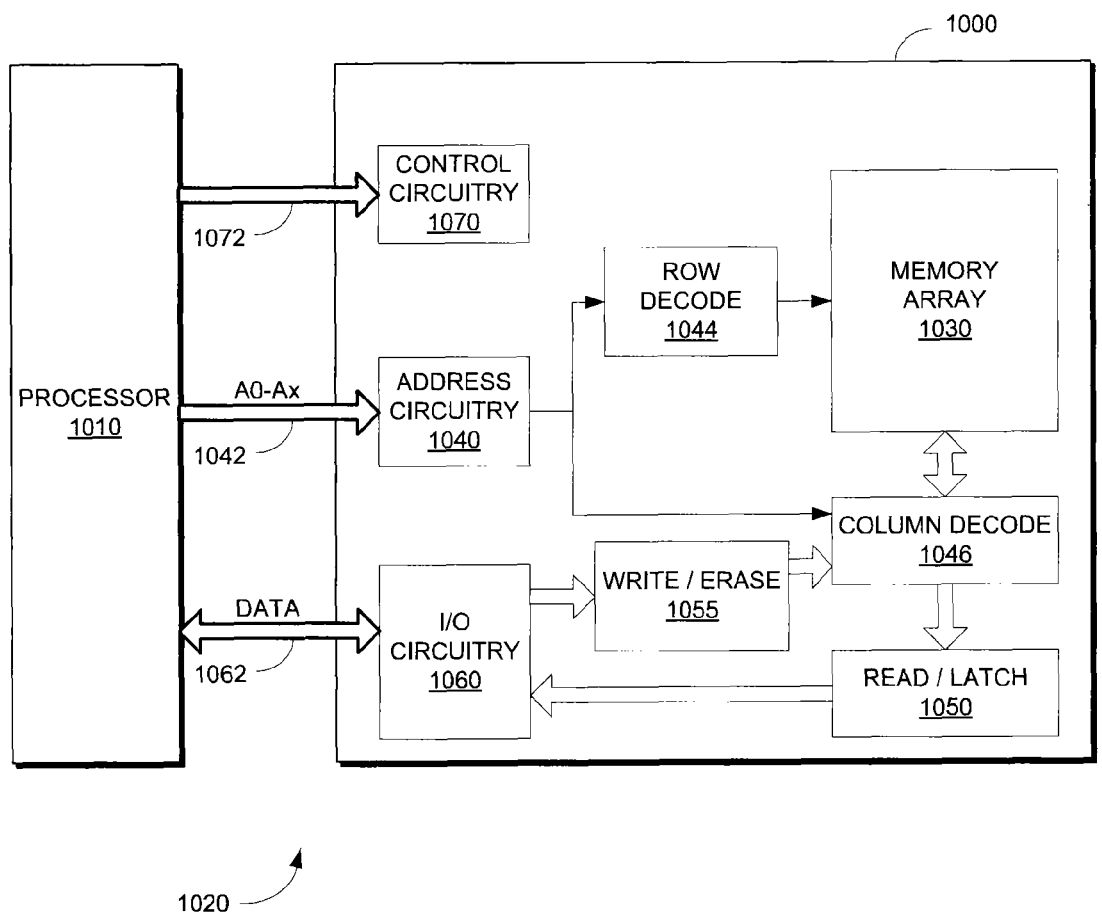
FIG. 10 is a functional block diagram of an electronic system having at least one memory device according to an embodiment of the present disclosure.

FIG. 10 is a functional block diagram of an electronic system having at least one memory device according to an embodiment of the present disclosure. The memory device 1000 is coupled to a processor 1010. The processor 1010 can be a microprocessor or some other type of controlling circuitry. The memory device 1000 and the processor 1010 form part of an electronic system 1020. The memory device 1000 has been simplified to focus on features of the memory that are helpful in understanding the present invention.

The memory device includes an array of memory cells 1030 that can be arranged in banks of rows and columns.

An address buffer circuit 1040 is provided to latch address signals provided on address input connections A0-Ax 1042. Address signals are received and decoded by a row decoder 1044 and a column decoder 1046 to access the memory array 1030. It will be appreciated by those skilled in the art, with the benefit of the present description, that the number of address input connections depends on the density and architecture of the memory array 1030. That is, the number of addresses increases with both increased memory cell counts and increased bank and block counts.

The memory device 1000 reads data in the memory array 1030 by sensing voltage or current changes in the memory array columns using sense/data cache circuitry 1050. The sense/data cache circuitry 1050, in one embodiment, is coupled to read and latch a row of data from the memory array 1030. Data input and output buffer circuitry 1060 is included for bi-directional data communication over a plurality of data connections 1062 with the controller 1010. Write circuitry 1055 is provided to write data to the memory array 1030.

Control circuitry 1070 is comprised in part of the various structures or features of the embodiments of the present disclosure. For example, control circuitry 1070 can include a command state machine, state machine, control registers and various decode blocks (e.g. macro, command/macro and instruction/macro decode blocks) according to the embodiments of the present disclosure. Control signals and commands can be sent to the memory device over the command bus 1072. The command bus 1072 may be a discrete signal or may be comprised of multiple signals (e.g. command bus). These command signals 1072 are used to control the operations on the memory array 1030, including data read, data write (program), and erase operations.

The memory device illustrated in FIG. 10 has been simplified to facilitate a basic understanding of the features of the electronic system. A more detailed understanding of internal circuitry and functions of memories are known to those skilled in the art.

CONCLUSION

Various embodiments of the present disclosure provide methods for executing internal memory device operations using instructions and data stored in the memory array of the memory device. The various embodiments also disclose apparatus adapted to perform the internal memory device operations executed from the memory array. These operations can include operations for testing memory devices during development, verification and production phases of the memory device.

Although specific embodiments have been illustrated and described herein, it will be appreciated by those of ordinary skill in the art that any arrangement, which is calculated to achieve the same purpose, may be substituted for the specific embodiments shown. This application is intended to cover any adaptations or variations of the present invention. Therefore, it is manifestly intended that this invention be limited only by the claims and the equivalents thereof.

What is claimed is:

1. A method of performing an internal diagnostic for a NAND configured memory device comprising:
    storing data in a data cache coupled to an array of memory cells arranged in a NAND configuration, wherein the data stored in the data cache corresponds to at least one diagnostic function;
    performing a decode operation on the data stored in the data cache, wherein the decode operation generates a diagnostic function command for testing internal functions of the NAND configured memory device; and
    providing the decoded diagnostic function command to a state machine of the NAND configured memory device adapted to perform the decoded diagnostic function command.

2. The method of claim 1, wherein the diagnostic function command comprises an instruction and an associated macro.

3. The method of claim 1, wherein storing data in the data cache comprises, in response to a first received command signal, performing a read operation of data corresponding to at least one internal operation function previously stored in an array of memory cells of the memory device.

4. The method of claim 3, wherein storing data in the data cache comprises loading data from input ports of the memory device in response to a second received command signal.

5. The method of claim 3, wherein the decode operation occurs in response to an end of array read signal generated by the state machine, wherein the end of array read signal is generated upon completion of the read operation.

6. The method of claim 3, wherein performing a read operation is controlled by the state machine.

7. The method of claim 1, wherein storing data in the data cache is in response to an externally received command signal.

8. The method of claim 1, wherein performing the decoded diagnostic function command further comprises performing the decoded diagnostic function command on a NAND configured memory device.

9. The method of claim 1, further comprising programming one or more op codes and associated data in predetermined locations of the memory array prior to performing the decode operation on data stored in the data cache.

10. The method of claim 9, wherein programming one or more op codes and associated data further comprises programming one or more op codes and associated data in predetermined locations of the memory array where the predetermined locations comprise memory cells adapted to operate as single level memory cells.

11. A method of performing an internal diagnostic for a NAND configured memory device comprising:
    performing a read operation on an array of memory cells of the NAND configured memory device, wherein data read during the read operation corresponds to at least one diagnostic function;
    storing the read data in a data cache coupled to the array of memory cells;
    performing a decode operation on the data stored in the data cache, wherein the decode operation generates a diagnostic function command for testing internal functions of the NAND configured memory device; and
    providing the decoded diagnostic function command to a state machine of the NAND configured memory device adapted to perform the decoded diagnostic function command.

12. The method of claim 11, further comprising:
    performing the decode operation in response to a signal generated upon completion of the read operation.

13. The method of claim 11, further comprising:
wherein performing the decode operation on the data stored in the data cache comprises decoding the data stored in the data cache into a format that mimics a format of instruction data and macro data stored in an instruction read-only memory and a macro read-only memory of the NAND configured memory device.

14. The method of claim 11, further comprising:
wherein performing the read operation on the array of memory cells comprises performing the read operation on a first memory bank of the array of memory cells; and
wherein the data cache is coupled to the first memory bank and comprises a primary data cache and a secondary data cache.

15. The method of claim 14, further comprising performing the decoded diagnostic function command, comprising:
reading expected test data from the first memory back;
reading second data from a second memory bank of the array of memory cells;
storing the expected test data read from the first memory bank in the primary data cache;
storing the second data read from the second memory bank in the secondary data cache; and
comparing the expected test data stored in the primary data cache to the second data stored in the secondary data cache.

16. The method of claim 11, wherein the data cache comprises a primary data cache and a secondary data cache, and further comprising performing the decoded diagnostic function command, comprising:
reading test data from a first location of the array of memory cells;
storing the test data read from the first location of the array of memory cells in the primary data cache;
reading expected test data from a second location of the array of memory cells;
storing the expected test data read from the second location of the array of memory cells in the secondary data cache; and
comparing the second data stored in the primary data cache to the expected test data stored in the secondary data cache.

17. The method of claim 11, wherein the data cache comprises a primary data cache and a secondary data cache, and further comprising performing the decoded diagnostic function command, comprising:
reading test data from a first location of the array of memory cells;
storing the test data read from the first location of the array of memory cells in the primary data cache;
reading expected test data from a second location of the array of memory cells;
storing the expected test data read from the second location of the array of memory cells in the secondary data cache; and
comparing the test data stored in the primary data cache to the expected test data stored in the secondary data cache.

18. A method of performing an internal diagnostic for a NAND configured memory device comprising:
receiving data at an I/O port of the NAND configured memory device, wherein the data received at the I/O port corresponds to at least one diagnostic function;
storing the received data in a data cache coupled to an array of memory cells arranged in a NAND configuration;
performing a decode operation on the data stored in the data cache, wherein the decode operation generates a diagnostic function command for testing internal functions of the NAND configured memory device; and
providing the decoded diagnostic function command to a state machine of the NAND configured memory device adapted to perform the decoded diagnostic function command.

19. The method of claim 18, wherein the data cache comprises a primary data cache and a secondary data cache, and further comprising performing the decoded diagnostic function command, comprising:
receiving expected test data at the I/O port;
storing the expected test data received at the I/O port in the primary data cache;
reading test data from a particular location of the array of memory cells;
storing the test data read from the particular location of the array of memory cells in the secondary data cache; and
comparing the expected test data stored in the primary data cache to the test data stored in the secondary data cache.

20. The method of claim 19, further comprising blocking memory cells of the particular location from future use when the test data stored in the secondary data cache does not match the expected test data stored in the primary data cache.

* * * * *